(12) United States Patent
Katsunuma

(10) Patent No.: US 10,811,274 B2
(45) Date of Patent: Oct. 20, 2020

(54) ETCHING METHOD AND PLASMA PROCESSING APPARATUS

(71) Applicant: TOKYO ELECTRON LIMITED, Tokyo (JP)

(72) Inventor: Takayuki Katsunuma, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 73 days.

(21) Appl. No.: 16/212,838

(22) Filed: Dec. 7, 2018

(65) Prior Publication Data

US 2019/0318936 A1 Oct. 17, 2019

(30) Foreign Application Priority Data

Apr. 17, 2018 (JP) .................................. 2018-079147

(51) Int. Cl.
*H01L 21/311* (2006.01)
*H01L 21/67* (2006.01)
*H01L 21/02* (2006.01)

(52) U.S. Cl.
CPC .. *H01L 21/31116* (2013.01); *H01L 21/02126* (2013.01); *H01L 21/02164* (2013.01); *H01L 21/67069* (2013.01)

(58) Field of Classification Search
CPC ............................ H01L 21/311–31116; H01L 21/02123–02126; H01L 21/02164; H01L 21/3065–30655
See application file for complete search history.

(56) References Cited

U.S. PATENT DOCUMENTS

| 6,451,620 | B2* | 9/2002 | Nakagawa | ........ | H01L 21/31138 |
| | | | | | 257/E21.256 |
| 8,999,856 | B2* | 4/2015 | Zhang | ............... | H01J 37/32422 |
| | | | | | 438/744 |
| 9,034,198 | B2* | 5/2015 | Nakagawa | ........ | H01L 21/31116 |
| | | | | | 216/51 |
| 9,312,105 | B2* | 4/2016 | Takahashi | ........ | H01J 37/32165 |
| 9,859,126 | B2* | 1/2018 | Kihara | ................ | H01L 21/3065 |
| 9,991,116 | B1* | 6/2018 | Liu | ..................... | H01L 21/0273 |
| 10,297,458 | B2* | 5/2019 | Yang | ................. | H01L 21/02164 |
| 10,297,459 | B2* | 5/2019 | Hudson | ............. | H01L 21/30655 |
| 10,304,676 | B2* | 5/2019 | Miyahara | .......... | H01L 21/02271 |

(Continued)

FOREIGN PATENT DOCUMENTS

JP 2003-229418 A 8/2003

*Primary Examiner* — Bac H Au
(74) *Attorney, Agent, or Firm* — Rothwell, Figg, Ernst & Manbeck, P.C.

(57) ABSTRACT

A method of etching selectively etches a first region of a substrate with respect to a second region of the substrate formed of a different material from the first region. A deposition film is formed of a chemical species included in plasma generated from a first gas. A gaseous precursor is supplied to the substrate having the deposition film formed thereon to form an adsorption film on the substrate from the precursor. Ions from plasma generated from a second gas are supplied to the substrate having the deposition film and the adsorption film formed thereon so as to cause a reaction between the material of the first region and a chemical species included in the deposition film, so that the first region is etched. The adsorption film reduces the etching rate of the second region during the etching of the first region.

16 Claims, 14 Drawing Sheets

(56) References Cited

U.S. PATENT DOCUMENTS

| | | | |
|---|---|---|---|
| 10,658,194 B2* | 5/2020 | Tan | H01L 21/31144 |
| 2009/0275202 A1* | 11/2009 | Tanaka | H01L 21/3065 |
| | | | 438/700 |
| 2013/0105303 A1* | 5/2013 | Lubomirsky | C23C 16/0245 |
| | | | 204/192.34 |
| 2014/0073113 A1* | 3/2014 | Nakahara | H01L 21/02164 |
| | | | 438/466 |
| 2016/0203995 A1* | 7/2016 | Kanarik | C23C 16/45527 |
| | | | 438/703 |
| 2018/0158650 A1* | 6/2018 | Sakane | H01L 21/0228 |
| 2019/0103265 A1* | 4/2019 | Kao | H01L 21/0214 |
| 2019/0252198 A1* | 8/2019 | Morikita | H01L 21/0228 |

* cited by examiner

ETCHING METHOD AND PLASMA PROCESSING APPARATUS

CROSS-REFERENCE TO RELATED APPLICATIONS

This application is based on and claims priority from Japanese Patent Application No. 2018-079147 filed on Apr. 17, 2018 with the Japan Patent Office, the disclosure of which is incorporated herein in its entirety by reference.

TECHNICAL FIELD

An exemplary embodiment of the present disclosure relates to an etching method and a plasma processing apparatus.

BACKGROUND

In the manufacture of electronic devices, plasma etching is applied to a substrate. In the plasma etching, the substrate is placed in a chamber of a plasma processing apparatus. Then, plasma is generated from a processing gas in the chamber. The substrate is etched by a chemical species, such as ions or radicals, from the plasma.

A kind of plasma etching is described in Japanese Laid-Open Patent Publication No. 2003-229418. The plasma etching described in Japanese Laid-Open Patent Publication No. 2003-229418 selectively etches a silicon nitride film with respect to a silicon oxide film. In the plasma etching described in Japanese Laid-Open Patent Publication No. 2003-229418, a mixture gas of $CH_3F$ gas and $O_2$ gas is used.

SUMMARY

In a first aspect, a method of etching a substrate is provided. The method includes (i) forming a deposition film on the substrate formed from a chemical species included in plasma generated from a first gas, the substrate having a first region and a second region formed of a different material from the first region, (ii) supplying a gaseous precursor to the substrate having the deposition film formed thereon, thereby forming an adsorption film on the substrate from the precursor, and (iii) selectively etching the first region over the second region by supplying ions from plasma generated from a second gas to the substrate having the deposition film and the adsorption film formed thereon so as to cause a reaction between the material of the first region and a chemical species included in the deposition film while reducing an etching rate of the second region by the adsorption film.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
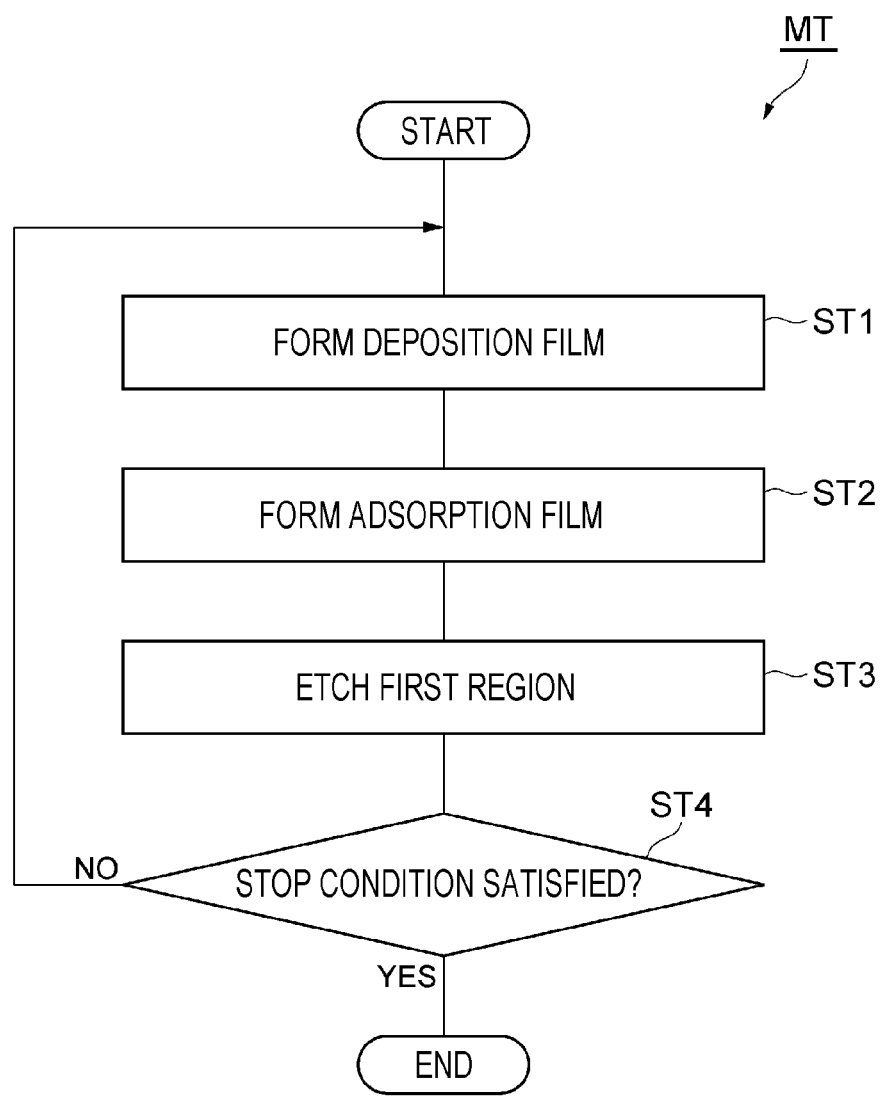
FIG. 1 is a flowchart illustrating an etching method according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In plasma etching, it is required to selectively etch a first region of a substrate with respect to a second region of the substrate. Then, it is required to increase the selectivity of etching of the first region with respect to the second region.

In a first aspect, a method of etching a substrate is provided. The method includes (i) forming a deposition film on the substrate formed from a chemical species included in plasma generated from a first gas, the substrate having a first region and a second region formed of a different material from the first region, (ii) supplying a gaseous precursor to the substrate having the deposition film formed thereon, thereby forming an adsorption film on the substrate from the precursor, and (iii) selectively etching the first region over the second region by supplying ions from plasma generated from a second gas to the substrate having the deposition film and the adsorption film formed thereon so as to cause a reaction between the material of the first region and a chemical species included in the deposition film while reducing an etching rate of the second region by the adsorption film.

In the method according to the first aspect, the reaction between the chemical species included in the deposition film and the material of the first region is promoted by the ions from the plasma generated from the second gas. As a result, the first region is etched. In addition, the adsorption film is formed on the substrate in order to reduce the etching rate of the second region in the etching the first region. Thus, according to the method of the first aspect, the selectivity of etching of the first region with respect to the second region may be enhanced.

In an embodiment, the adsorption film may reduce an amount of a chemical species in the deposition film that etches the second region.

In an embodiment, the deposition film may include carbon, hydrogen, and fluorine.

In an embodiment, the first gas may include a hydrofluorocarbon gas. In an embodiment, the hydrofluorocarbon gas may include $CH_3F$ gas.

In an embodiment, the first region may be formed of silicon nitride.

In an embodiment, the adsorption film may reduce an amount of fluorine in the deposition film that etches the second region. In an embodiment, the second region may include silicon. In an embodiment, the adsorption film may include silicon. In an embodiment, the gaseous precursor may be a silicon-containing gas.

In a second aspect, a plasma processing apparatus is provided. The plasma processing apparatus includes a chamber, a support, a gas supply unit, a plasma generation unit, and a controller. The support is configured to support a substrate in an inner space of the chamber. The gas supply unit is configured to supply a gas to the inner space of the chamber. The plasma generation unit is configured to excite the gas in the inner space of the chamber so as to generate plasma. The controller is configured to control the gas supply unit and the plasma generation unit.

In the plasma processing apparatus of the second aspect, the controller controls the gas supply unit and the plasma generation unit so as to generate plasma from a first gas in the inner space in a state where the substrate is placed on the support. The substrate includes a first region and a second region. The second region is formed of a different material from the first region. A deposition film is formed on the substrate from a chemical species included in the plasma generated from the first gas. The controller controls the gas supply unit so as to supply a gaseous precursor to the substrate in a state where the substrate having the deposition film formed thereon is placed on the support. An adsorption film is formed on the substrate from the precursor. The controller controls the gas supply unit and the plasma generation unit so as to generate plasma from a second gas in the inner space of the chamber in a state where the substrate having the deposition film and the adsorption film formed thereon is placed on the support. Ions from the plasma generated from the second gas are supplied to the substrate. The first region is etched via a reaction between the material of the first region and a chemical species included in the deposition film. The adsorption film reduces an etching rate of the second region during etching of the first region.

In a third aspect, a method of etching a substrate is provided. The method includes (i) forming a deposition film on the substrate having a first region and a second region formed of a different material from the first region, (ii) forming a monomolecular adsorption film on the substrate having the deposition film formed thereon, and (iii) selectively etching the first region over the second region by supplying ions from plasma to the substrate having the deposition film and the adsorption film formed thereon so as to cause a reaction between a material of the first region and a chemical species included in the deposition film while reducing an etching rate of the second region by the adsorption film.

In the method according to the third aspect, the reaction between the chemical species included in the deposition film and the material of the first region is promoted by the ions from the plasma. As a result, the first region is etched. In addition, in order to reduce the etching rate of the second region in the etching the first region, the adsorption film is formed on the substrate. Thus, according to the method of the third aspect, the selectivity of etching of the first region with respect to the second region may be enhanced.

In an embodiment, the substrate may be formed with an opening. The first region may be a bottom portion defining the opening. The second region may be a side portion defining the opening.

In an embodiment, the substrate may include a film including the first region and the second region. The opening may be formed in the film. In an embodiment, the film may be a silicon oxide film or a SiOCH film.

In an embodiment, the deposition film may include carbon and fluorine, and the adsorption film may reduce an amount of fluorine in the deposition film. In this embodiment, fluorine in the deposition film reacts with a chemical species of the adsorption film, and is removed. As a result, a protective film is formed from the deposition film. The content of carbon of the protective film is relatively high. Thus, the protection film prevents the second region, i.e. the side portion from being etched during the etching of the first region.

In a fourth aspect, a plasma processing apparatus is provided. The plasma processing apparatus includes a chamber, a support, a gas supply unit, a plasma generation unit, and a controller. The support is configured to support a substrate in an inner space of the chamber. The gas supply unit is configured to supply a gas to the inner space. The plasma generation unit is configured to excite the gas in the inner space so as to generate plasma. The controller is configured to control the gas supply unit and the plasma generation unit.

In the plasma processing apparatus of the fourth aspect, the controller controls the gas supply unit and the plasma generation unit so as to form a deposition film on the substrate in a state where the substrate is placed on the support. The substrate includes a first region and a second region. The controller controls the gas supply unit so as to form an adsorption film, which is a monomolecular adsorption film, on the substrate in a state where the substrate having the deposition film formed thereon is placed on the support. The controller controls the gas supply unit and the plasma generation unit so as to generate plasma in the inner space in a state where the substrate having the deposition film and the adsorption film formed thereon is placed on the support. Ions from the plasma are supplied to the substrate so that the first region is etched via a reaction between a material of the first region and a chemical species included in the deposition film. The adsorption film reduces an etching rate of the second region during the etching of the first region.

As described above, it is possible to enhance the selectivity of etching of a first region with respect to a second region.

Hereinafter, various embodiments will be described in detail with reference to the accompanying drawings. In addition, in the respective drawings, the same reference numerals will be attached to the same or corresponding parts.

FIG. 1 is a flowchart illustrating an etching method according to an embodiment. Method MT illustrated in FIG. 1 is executed in order to selectively etch a first region of a substrate with respect to a second region of the substrate.

Figure 2A:
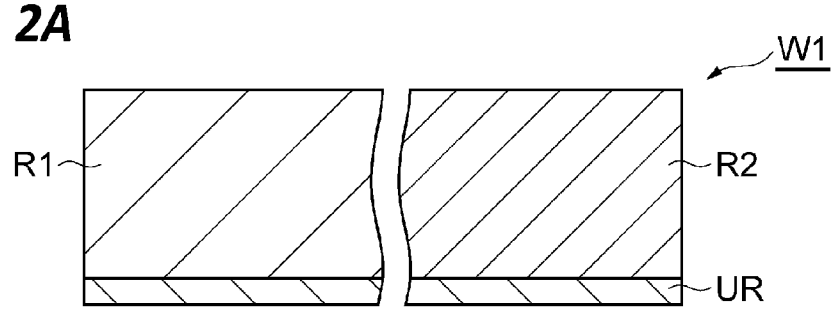
FIG. 2A is a partially enlarged cross-sectional view of an substrate, to which the method illustrated in FIG. 1 may be applied.

FIG. 2A is a partially enlarged cross-sectional view of an exemplary substrate, to which the method illustrated in FIG. 1 may be applied. The substrate W1 illustrated in FIG. 2A includes a first region R1 and a second region R2. The first region R1 and the second region R2 may be set on a base region UR. The second region R2 may be formed of a different material from the first region R1. In one example, the first region R1 is formed of silicon nitride, and the second region R2 is formed of any other silicon material. The second region R2 is formed of, for example, silicon, polycrystalline silicon, or silicon oxide.

Figure 3:
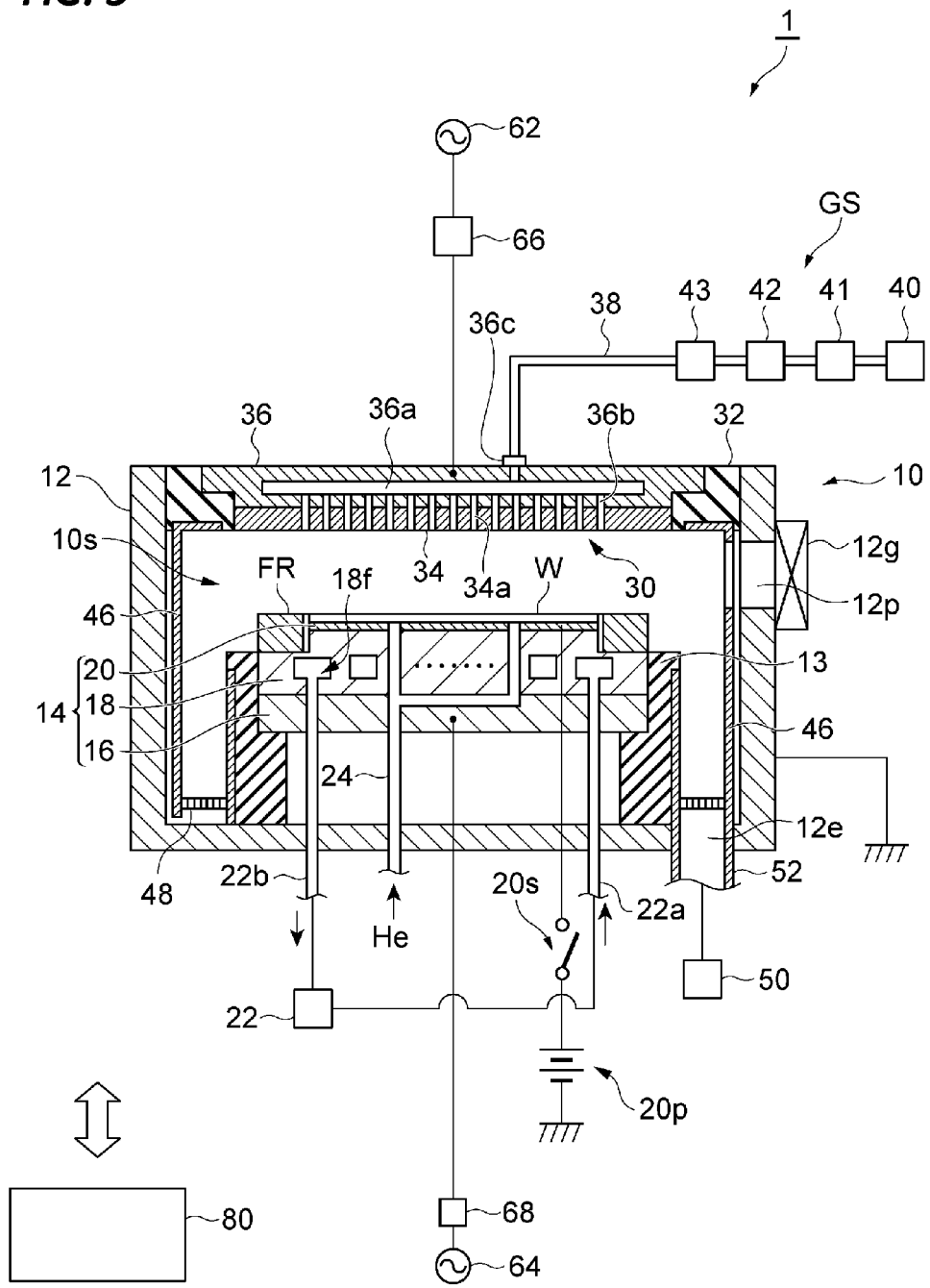
FIG. 3 is a view illustrating an plasma processing apparatus that may be used in an etching method according to various embodiments.

In the method MT, a plasma processing apparatus is used for etching the first region of the substrate. FIG. 3 is a view illustrating an exemplary plasma processing apparatus that may be used in an etching method according to various embodiments. The plasma processing apparatus 1 illustrated in FIG. 3 is a capacitively coupled plasma etching apparatus. The plasma processing apparatus 1 includes a chamber 10. The chamber 10 provides an inner space 10s therein.

The chamber 10 includes a chamber body 12. The chamber body 12 has a substantially cylindrical shape. The inner space 10s is provided inside the chamber body 12. The chamber body 12 is formed of, for example, aluminum. A film having corrosion resistance is applied to the inner wall surface of the chamber body 12. The film having corrosion resistance may be a film formed of ceramic such as aluminum oxide or yttrium oxide.

A passage 12p is formed in the sidewall of the chamber body 12. The substrate W passes through the passage 12p when conveyed between the inner space 10s and the outside of the chamber 10. The passage 12p may be opened and closed by a gate valve 12g. The gate valve 12g is provided along the sidewall of the chamber body 12.

A support unit 13 is provided on the bottom portion of the chamber body 12. The support unit 13 is formed of an insulation material. The support unit 13 has a substantially cylindrical shape. The support unit 13 extends upward from the bottom portion of the chamber body 12 in the inner space 10s. The support unit 13 supports a support 14. The support 14 is provided in the inner space 10s. The support 14 is configured to support the substrate W in the inner space 10s.

The support 14 includes a lower electrode 18 and an electrostatic chuck 20. The support 14 may further include an electrode plate 16. The electrode plate 16 is formed of a conductor such as aluminum, for example, and has a substantially disc shape. The lower electrode 18 is provided on the electrode plate 16. The lower electrode 18 is formed of a conductor such as aluminum, for example, and has a substantially disk shape. The lower electrode 18 is electrically connected to the electrode plate 16.

The electrostatic chuck 20 is provided on the lower electrode 18. The substrate W is placed on the upper surface of the electrostatic chuck 20. The electrostatic chuck 20 includes a body and an electrode. The body of the electrostatic chuck 20 is formed of a dielectric material. The electrode of the electrostatic chuck 20 is a film-shaped electrode, and is provided in the body of the electrostatic chuck 20. The electrode of the electrostatic chuck 20 is connected to a DC power supply 20p via a switch 20s. When a voltage from the DC power supply 20p is applied to the electrode of the electrostatic chuck 20, an electrostatic attractive force is generated between the electrostatic chuck 20 and the substrate W. The substrate W is attracted to the electrostatic chuck 20 and held by the electrostatic chuck 20 by the generated electrostatic attractive force.

A focus ring FR is disposed on the peripheral portion of the lower electrode 18 so as to surround the edge of the substrate W. The focus ring FR is provided in order to improve the in-plane uniformity of a plasma processing on the substrate W. The focus ring FR may be formed of silicon, silicon carbide, or quartz, without being limited thereto.

A flow path 18f is formed inside the lower electrode 18. A heat exchange medium (e.g., a coolant) is supplied to the flow path 18f from a chiller unit 22, which is provided outside the chamber 10, through a pipe 22a. The heat exchange medium supplied to the flow path 18f is returned to the chiller unit 22 through a pipe 22b. In the plasma processing apparatus 1, the temperature of the substrate W placed on the electrostatic chuck 20 is adjusted by heat exchange between the heat exchange medium and the lower electrode 18.

The plasma processing apparatus 1 is provided with a gas supply line 24. The gas supply line 24 supplies a heat transfer gas (e.g., He gas) from a heat transfer gas supply mechanism to a space between the upper surface of the electrostatic chuck 20 and the back surface of the substrate W.

The plasma processing apparatus 1 further includes an upper electrode 30. The upper electrode 30 is provided above the support 14. The upper electrode 30 is supported on the upper portion of the chamber body 12 via a member 32. The member 32 is formed of a material having an insulation property. The upper electrode 30 and the member 32 close an upper opening in the chamber body 12.

The upper electrode 30 may include an upper plate 34 and a support body 36. The lower surface of the upper plate 34 is a lower surface on the inner space 10s side and defines the inner space 10s. The upper plate 34 may be formed of a low resistance conductor or semiconductor having low Joule heat. Multiple gas discharge holes 34a are formed in the upper plate 34. The multiple gas discharge holes 34a are formed in the upper plate 34 in a plate thickness direction.

The support body 36 detachably supports the upper plate 34. The support body 36 is formed of a conductive material such as aluminum. A gas diffusion chamber 36a is provided inside the support body 36. Multiple gas holes 36b are formed in the support body 36. The multiple gas holes 36b extend downward from the gas diffusion chamber 36a. The multiple gas holes 36b communicate with the multiple gas discharge holes 34a, respectively. A gas introduction port 36c is formed in the support body 36. The gas introduction port 36c is connected to the gas diffusion chamber 36a. A gas supply pipe 38 is connected to the gas introduction port 36c.

A gas source group 40 is connected to the gas supply pipe 38 via a valve group 41, a flow rate controller group 42, and a valve group 43. The gas source group 40, the valve group 41, the flow rate controller group 42, and the valve group 43 constitute a gas supply unit GS. The gas source group 40 includes multiple gas sources. The multiple gas sources of the gas source group 40 include sources of multiple gases used in method MT. Each of the valve group 41 and the valve group 43 includes multiple opening and closing valves. The flow rate controller group 42 includes multiple flow rate controllers. Each of the multiple flow rate controllers of the flow rate controller group 42 is a mass flow controller or a pressure control type flow controller. Each of the multiple gas sources of the gas source group 40 is connected to the gas supply pipe 38 via a corresponding opening and closing valve of the valve group 41 and a corresponding flow rate controller of the flow rate controller group 42, and a corresponding opening and closing valve of the valve group 43.

In the plasma processing apparatus 1, a shield 46 is detachably provided along the inner wall surface of the chamber body 12. The shield 46 is also provided on the outer periphery of the support unit 13. The shield 46 prevents etching byproducts from adhering to the chamber body 12. The shield 46 is configured, for example, by forming a film having corrosion resistance on the surface of a base material formed of aluminum. The film having corrosion resistance may be a film formed of ceramic such as yttrium oxide.

A baffle plate 48 is provided between the support unit 13 and the sidewall of the chamber body 12. The baffle plate 48 is configured, for example, by forming a film having corrosion resistance on the surface of a base material formed of aluminum. The film having corrosion resistance may be a film formed of ceramic such as yttrium oxide. Multiple through-holes are formed in the baffle plate 48. An exhaust port 12e is provided below the baffle plate 48 and in the bottom portion of the chamber body 12. An exhaust device 50 is connected to the exhaust port 12e via an exhaust pipe 52. The exhaust device 50 includes a vacuum pump (atmospheric water pump), such as a pressure regulating valve and a turbo molecular pump.

The plasma processing apparatus 1 further includes a first high frequency power supply 62 and a second high frequency power supply 64. The first high frequency power supply 62 is a power supply that generates first high frequency power. The first high frequency power has a frequency suitable for plasma generation. The frequency of the first high frequency power is, for example, a frequency within the range from 27 MHz to 100 MHz. The first high frequency power supply 62 is connected to the upper electrode 30 via a matcher 66 and the electrode plate 16. The matcher 66 includes a circuit for matching the output impedance of the first high frequency power supply 62 with the impedance of the load side (the upper electrode 30 side). In addition, the first high frequency power supply 62 may be connected to the lower electrode 18 via the matcher 66.

The second high frequency power supply 64 is a power supply that generates second high frequency power. The second high frequency power has a frequency lower than the frequency of the first high frequency power. In a case where the second high frequency power is used together with the first high frequency power, the second high frequency power is used as bias high frequency power for introducing ions into the substrate W. The frequency of the second high frequency power is, for example, a frequency within the range from 400 kHz to 13.56 MHz. The second high frequency power supply 64 is connected to the lower electrode 18 via a matcher 68 and the electrode plate 16. The matcher 68 includes a circuit for matching the output impedance of the second high frequency power supply 64 with the impedance of the load side (the lower electrode 18 side). In addition, plasma may be generated using second high frequency waves without using first high frequency waves, i.e., using only single high frequency waves. In this case, the frequency of the second high frequency wave may be a frequency greater than 13.56 MHz, for example 40 MHz. In this case, the plasma processing apparatus 1 may not include the first high frequency power supply 62 and the matcher 66.

In a case where plasma is generated in the plasma processing apparatus 1, a gas is supplied from the gas supply unit GS to the inner space 10s. In addition, by supplying the first high frequency power and/or the second high frequency power, a high frequency electric field is generated between the upper electrode 30 and the lower electrode 18. The gas is excited by the generated high frequency electric field. As a result, plasma is generated. In the plasma processing apparatus 1, the first high frequency power supply 62 and/or the second high frequency power supply 64, the upper electrode 30, and the lower electrode 18 constitute a plasma generation unit.

The plasma processing apparatus 1 may further include a controller 80. The controller 80 may be a computer including a processor, a storage unit such as a memory, an input device, a display device, and a signal input/output interface, for example. The controller 80 controls each unit of the plasma processing apparatus 1. An operator may perform, for example, a command input operation for managing the plasma processing apparatus 1 using the input device of the controller 80. In addition, the controller 80 may visualize and display an operation status of the plasma processing apparatus 1 using the display device. Moreover, a control program and recipe data are stored in the storage unit of the controller 80. The control program is executed by the processor of the controller 80 in order to execute various processings in the plasma processing apparatus 1. The processor of the controller 80 executes the control program to control each unit of the plasma processing apparatus 1 according to the recipe data, so that method MT is executed in the plasma processing apparatus 1.

Figure 2B:
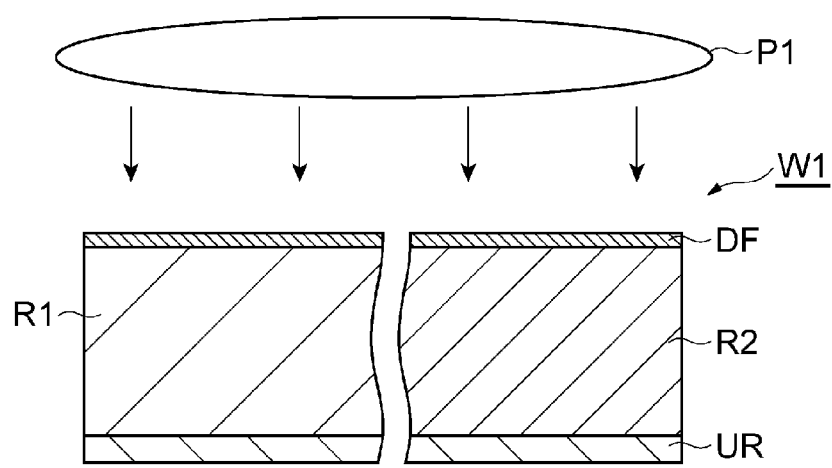
FIG. 2B is a view for explaining step ST1 of the method illustrated in FIG. 1.
Figure 2C:
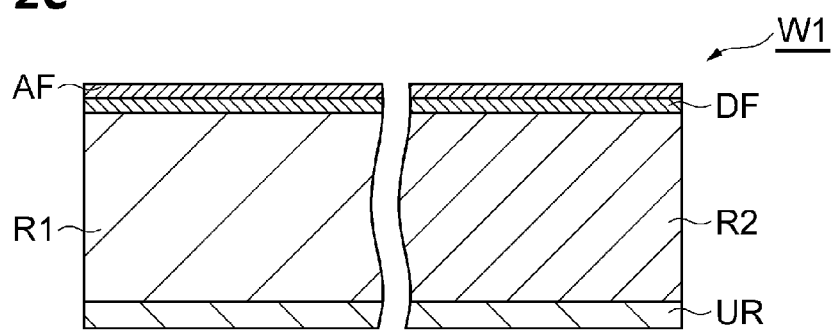
FIG. 2C is a view for explaining step ST2 of the method illustrated in FIG. 1.
Figure 4A:
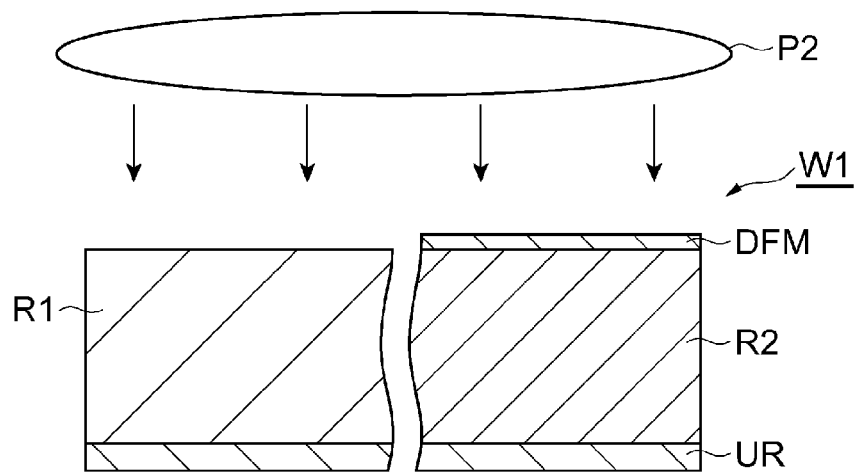
FIG. 4A is a view for explaining step ST3 of the method illustrated in FIG. 1.
Figure 4B:
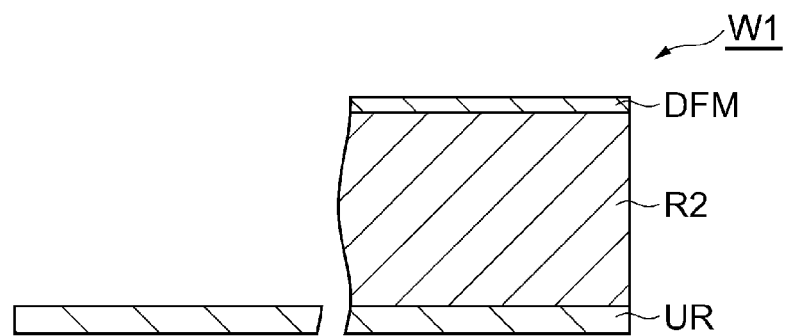
FIG. 4B is a partially enlarged cross-sectional view of an exemplary substrate in a state after execution of the method illustrated in FIG. 1.
Figure 5:
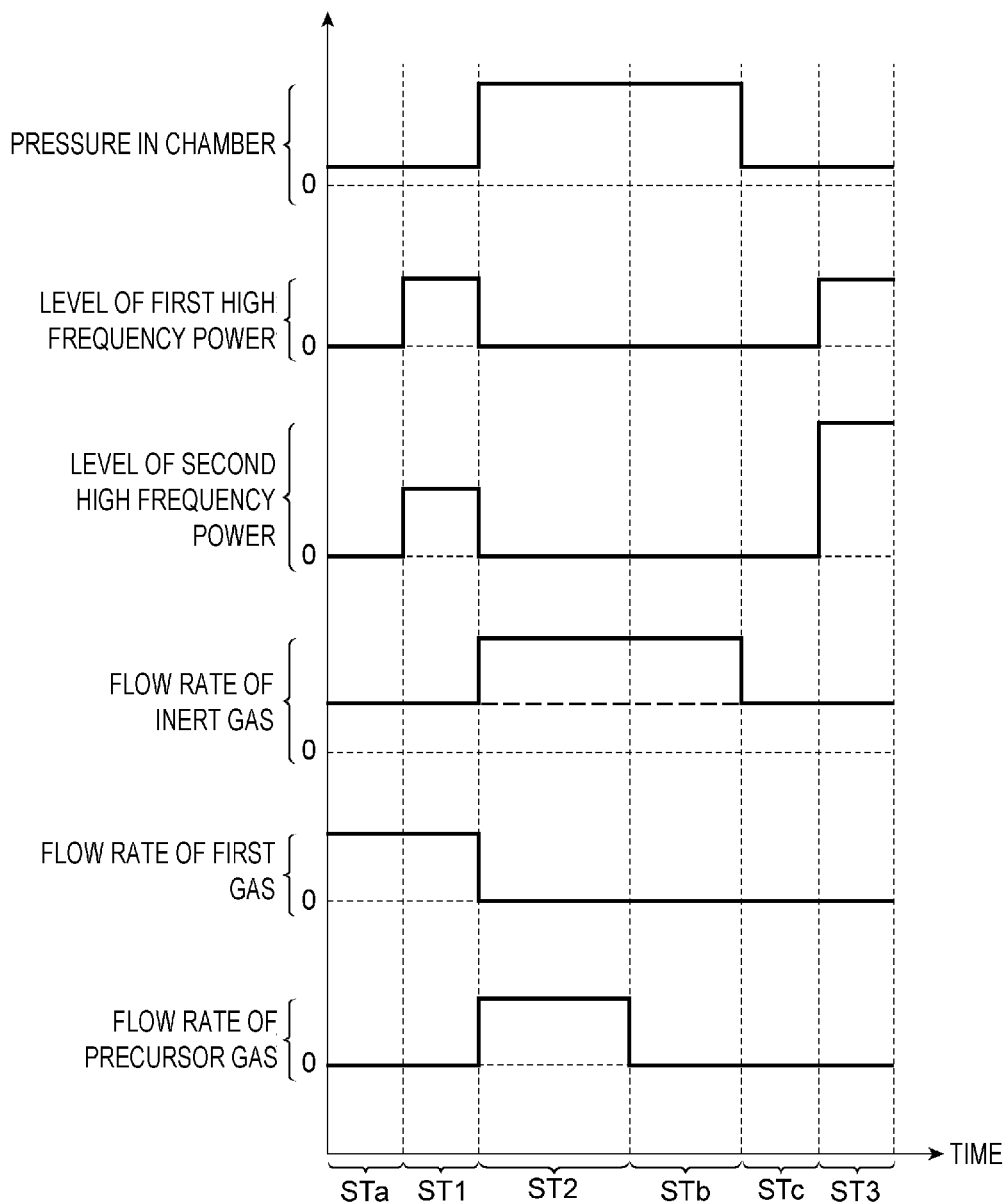
FIG. 5 is an exemplary timing chart related to the method illustrated in FIG. 1.
Figure 6:
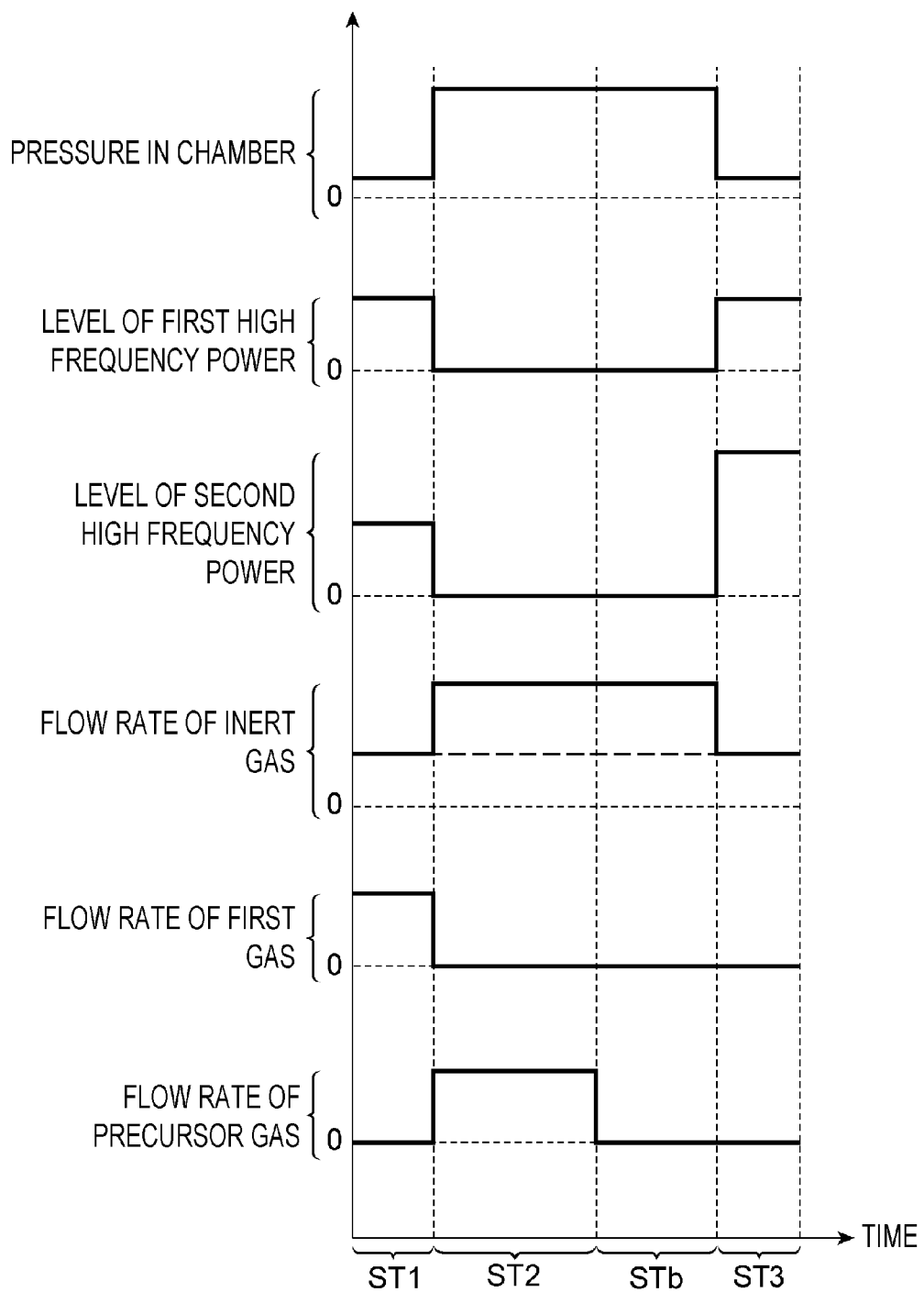
FIG. 6 is another exemplary timing chart related to the method illustrated in FIG. 1.

Referring again to FIG. 1, hereinafter, method MT will be described by taking as an example a case where the plasma processing apparatus 1 is used to etch the first region R1 of the substrate W1. In the following description, in addition to FIG. 1, reference will be made to FIGS. 2B, 2C, 4A, 4B, 5 and 6. FIG. 2B is a view for explaining step ST1 of the method illustrated in FIG. 1, and FIG. 2C is a view for explaining step ST2 of the method illustrated in FIG. 1. FIG. 4A is a view for explaining step ST3 of the method illustrated in FIG. 1, and FIG. 4B is a partially enlarged cross-sectional view of an exemplary substrate in a state after execution of the method illustrated in FIG. 1. FIG. 5 is an exemplary timing chart related to the method illustrated in FIG. 1. FIG. 6 is another exemplary timing chart related to the method illustrated in FIG. 1. In the timing charts of FIGS. 5 and 6, the horizontal axis represents time. In the timing charts of FIGS. 5 and 6, the vertical axis represents the pressure in the chamber 10, the level of the first high frequency power (power level), the level of the second high frequency power (power level), the flow rate of an inert gas, and the flow rate of a first gas, and the flow rate of a gaseous precursor.

Method MT illustrated in FIG. 1 is executed in a state where the substrate W1 is placed on the support 14. In step ST1 of method MT, a deposition film DF is formed on the substrate W1. The deposition film DF includes a chemical species that reacts with the material of the first region R1 to etch the first region R1 in step ST3 to be described later. In step ST1, the gas supply unit GS and the plasma generation unit are controlled so as to form the deposition film DF on the substrate W1.

In step ST1 in an embodiment, in order to form the deposition film DF on the substrate W1, plasma is generated from a first gas in the inner space 10s. In step ST1, the gas supply unit GS is controlled by the controller 80 so as to supply the first gas to the inner space 10s. In step ST1, the gas supply unit GS may be controlled by the controller 80 so as to further supply an inert gas to the inner space 10s. In step ST1, the exhaust device 50 is controlled so that the pressure in the chamber 10 (the pressure in the inner space 10s) is set to a designated pressure. The pressure in the inner space 10s is, for example, a pressure within the range from 10 mTorr (1.333 Pa) to 100 mTorr (13.33 Pa), or a pressure within the range from 20 mTorr (2.666 Pa) to 50 mTorr (6.666 Pa).

In step ST1, the first high frequency power supply 62 is controlled by the controller 80 so as to supply the first high frequency power in order to excite the first gas. The frequency of the first high frequency power is, for example, 60 MHz. In a case where the diameter of the substrate is 300 mm, the power level of the first high frequency power is, for example, a power level within the range from 50 W to 300 W or a power level within the range from 50 W to 150 W. In step ST1, the second high frequency power supply 64 may be controlled by the controller 80 so as to further supply the second high frequency power. The frequency of the second high frequency power is, for example, 40 MHz. The power level of the second high frequency power is set to a low level in order to prevent formation of the deposition film DF from being hindered by collision of ions with the substrate W1 due to high energy. In a case where the diameter of the substrate is 300 mm, the power level of the second high frequency power is, for example, a power level within the range from 0 W to 250 W or a power level within the range from 0 W to 150 W. The processing time of step ST1 is, for example, a processing time within the range from 2 seconds to 20 seconds, or a processing time within the range from 3 seconds to 10 seconds.

As illustrated in FIG. 5, the process STa may be executed before the process ST1 is executed. In step STa, the first gas and the inert gas are supplied to the inner space 10s without generating plasma. That is, in step STa, the first high frequency power and the second high frequency power are not supplied. Step ST1 is executed after step STa is executed for a predetermined time. Alternatively, as illustrated in FIG. 6, step STa may not be executed. In a case where step STa is not executed in method MT, the throughput of method MT is improved.

In step ST1, the first gas is excited, and plasma P1 is generated from the first gas in the inner space 10s. In step ST1, as illustrated in FIG. 2B, a chemical species from the plasma P1 is deposited on the surface of the substrate W1. As a result, the deposition film DF is formed on the surface of the substrate W1. In step ST1, not only the deposition film DF is formed, but etching of the first region R1 may be caused by the chemical species from the plasma P1.

In the embodiment, the first region R1 is formed of silicon nitride. In order to etch the first region R1 in step ST3 to be described later, in the embodiment, the deposition film DF includes carbon, hydrogen, and fluorine. In the embodiment, the first gas may include a hydrofluorocarbon gas, in order to form the deposition film DF including carbon, hydrogen and fluorine in step ST1. The hydrofluorocarbon gas is, for example, $CH_3F$ gas.

In the subsequent step ST2, an adsorption film AF is formed on the substrate W1 on which the deposition film DF has been formed. The adsorption film AF may be a monomolecular film. In step ST2, the gas supply unit GS is controlled by the controller 80 so as to form the adsorption film AF.

In step ST2 in the embodiment, a gaseous precursor is supplied to the substrate W1 on which the deposition film DF has been formed. In step ST2, the gas supply unit GS is controlled by the controller 80 so as to supply the gaseous precursor to the inner space 10s. In step ST2, the gas supply unit GS may be controlled by the controller 80 so as to further supply the inert gas to the inner space 10s. As indicated by broken lines in FIGS. 5 and 6, the flow rate of the inert gas in step ST2 may be the same as the flow rate of the inert gas in step ST1. Alternatively, as illustrated by solid lines in FIGS. 5 and 6, the flow rate of the inert gas in step ST2 may be greater than the flow rate of the inert gas in step ST1.

In step ST2, the exhaust device 50 is controlled so that the pressure in the chamber 10 (the pressure in the inner space 10s) is set to a designated pressure. The pressure in the inner space 10s in step ST2 may be higher than the pressure in the inner space 10s in step ST1. In a case where the pressure in the inner space 10s in step ST2 is high, the gaseous precursor is adsorbed onto the entire surface of the substrate W1 within a short time. In step ST2, plasma is not generated. That is, in step ST2, the first high frequency power and the second high frequency power are not supplied.

In step ST2, the adsorption film AF is formed on the substrate W1 from the precursor, as illustrated in FIG. 2C. The adsorption film AF reduces the etching rate of the second region R2 in step ST3 to be described later. In the embodiment, the adsorption film AF reduces the amount of a chemical species in the deposition film DF that etches the second region R2. In the embodiment, the adsorption film AF may reduce the amount of fluorine in the deposition film DF that etches the second region R2. In the embodiment, the second region R2 may include silicon. For example, the second region R2 is formed of silicon, polycrystalline silicon, or silicon oxide. In this case, the gaseous precursor may be a silicon-containing gas. The silicon-containing gas is, for example, an aminosilane gas.

As illustrated in FIGS. 5 and 6, after step ST2 is executed, step STb may be executed. In step STb, purging of the inner space 10s is performed without generating plasma. In step STb, the first high frequency power and the second high frequency power are not supplied. In step STb, the gaseous precursor in the inner space 10s is evacuated. In step STb, the inert gas may be supplied to the inner space 10s.

In the subsequent step ST3, the first region R1 is etched. In step ST3, ions from plasma P2, generated from a second gas, are supplied to the substrate W1 on which the deposition film DF and the adsorption film AF have been formed. The second gas includes an inert gas. In the embodiment, the second gas includes only the inert gas. The inert gas may be a rare gas. The rare gas is, for example, Ar gas, without being limited thereto. In step ST3, the energy of the ions from the plasma P2 causes a reaction between the material of the first region R1 and the chemical species included in the deposition film DF. A reaction product produced by this reaction is removed from the substrate W1. As a result, as illustrated in FIG. 4A, the first region R1 is etched.

In step ST3, the chemical species in the deposition film DF on the second region R2 reacts with a chemical species of the adsorption film AF, so that a protective film DFM is formed from the deposition film DF. In one example, fluorine in the deposition film DF on the second region R2 reacts with silicon of the adsorption film AF, and is removed from the deposition film DF. As a result, the amount of fluorine in the deposition film DF decreases so that the protective film DFM is formed from the deposition film DF.

In step ST3, the gas supply unit GS is controlled by the controller 80 so as to supply the second gas to the inner space 10s. As illustrated in FIGS. 5 and 6, the flow rate of the inert gas in step ST3 may be the same as the flow rate of the inert gas in step ST2, or may be less than the flow rate of the inert gas in step ST2. In step ST3, the exhaust device 50 is controlled so that the pressure in the chamber 10 (the pressure in the inner space 10s) is set to a designated pressure.

In step ST3, the first high frequency power supply 62 is controlled by the controller 80 so as to supply the first high frequency power in order to excite the second gas. The frequency of the first high frequency power is, for example, 60 MHz. The power level of the first high frequency power in step ST3 may be the same as or different from the power level of the first high frequency power in step ST1. In step ST3, the second high frequency power supply 64 is controlled by the controller 80 so as to further supply the second high frequency power. The frequency of the second high frequency power is, for example, 40 MHz. The power level of the second high frequency power in step ST3 may be a suitable level. In the embodiment, the power level of the second high frequency power in step ST3 is greater than the power level of the second high frequency power in step ST1.

As illustrated in FIG. 5, step STc may be executed after step STb is executed and before step ST3 is executed. In step STc, the flow rate of the inert gas is set to the same flow rate of the inert gas as in step ST3. Step STc is executed for a predetermined time.

In the subsequent step ST4, it is determined whether or not a stop condition is satisfied. The stop condition is determined to be satisfied when the number of executions of a sequence that includes step ST1 to step ST3 has reached a predetermined number of times. When it is determined in step ST4 that the stop condition is not satisfied, the sequence is executed again. On the other hand, when it is determined in step ST4 that the stop condition is satisfied, method MT ends. After method MT ends, as illustrated in FIG. 4B, the first region R1 is etched so that, for example, the base region UR is exposed.

In the above-described method MT, the reaction between the chemical species included in the deposition film DF and the material of the first region R1 is promoted by the ions from the plasma generated from the second gas. As a result, the first region R1 is etched. In order to reduce the etching rate of the second region R2 in step ST3, the adsorption film AF is formed on the substrate W1. Therefore, the selectivity of etching of the first region R1 with respect to the second region R2 may be enhanced.

In the embodiment, the deposition film DF includes carbon, fluorine, and hydrogen, the first region R1 is formed of silicon nitride, and the second region R2 is formed of any other silicon material. The adsorption film AF includes silicon. The silicon of the adsorption film AF bonds with the fluorine of the deposition film DF, and reduces the amount of chemical species that may etch the second region R2. Thus, in step ST3, the etching rate of the second region R2 is lowered, so that the first region R1 is selectively etched with respect to the second region R2.

Figure 7A:
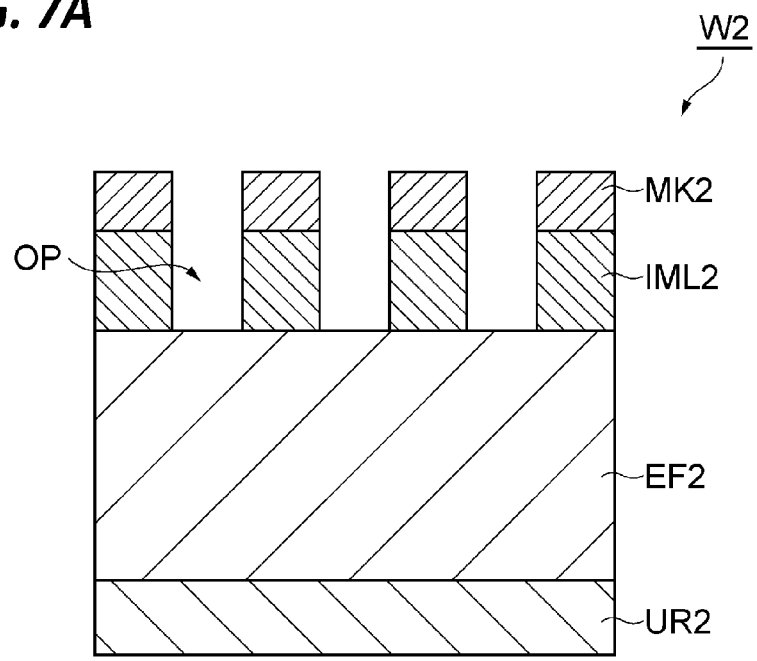
FIG. 7A is a partially enlarged cross-sectional view of another exemplary substrate, to which the method illustrated in FIG. 1 may be applied.
Figure 7B:
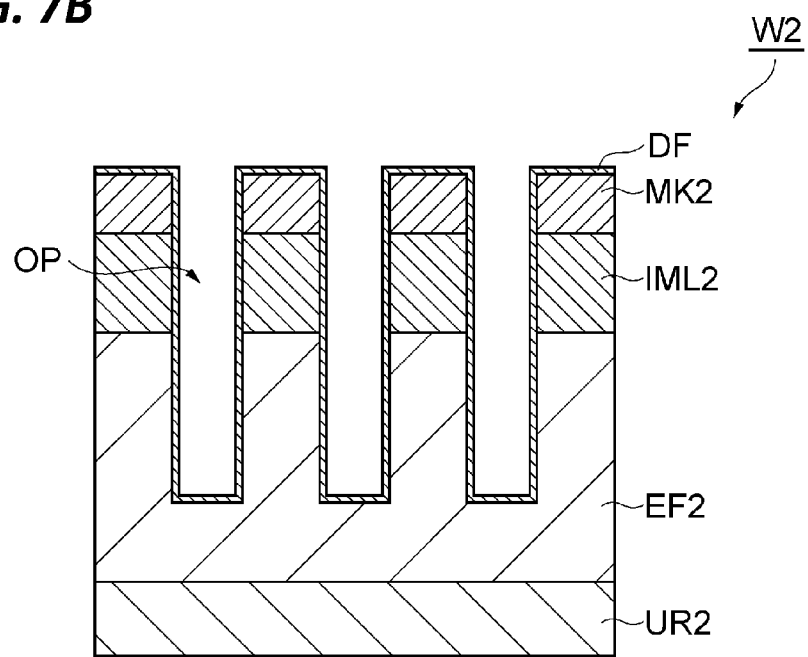
FIG. 7B is a partially enlarged cross-sectional view of the other exemplary substrate in a state after execution of step ST1.
Figure 8A:
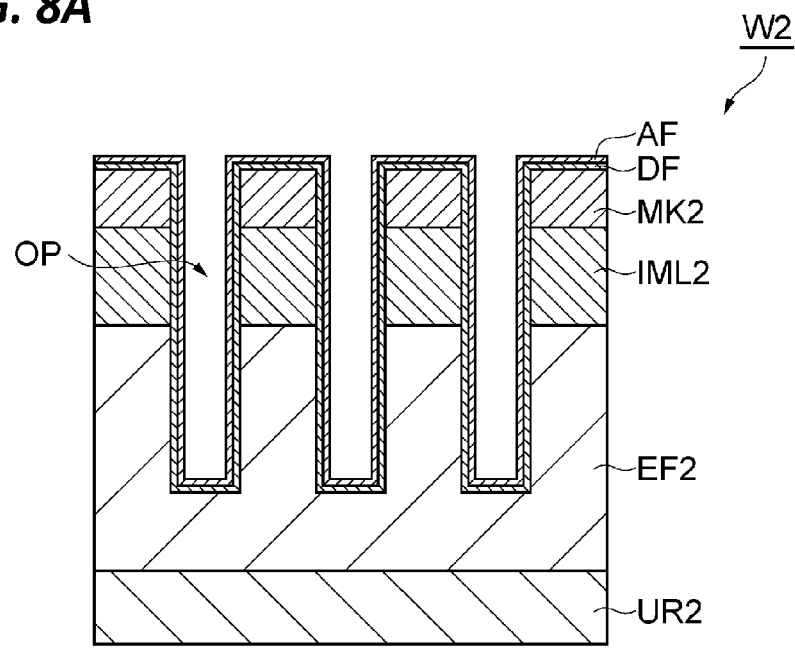
FIG. 8A is a partially enlarged cross-sectional view of the other exemplary substrate in a state after execution of step ST2.
Figure 8B:
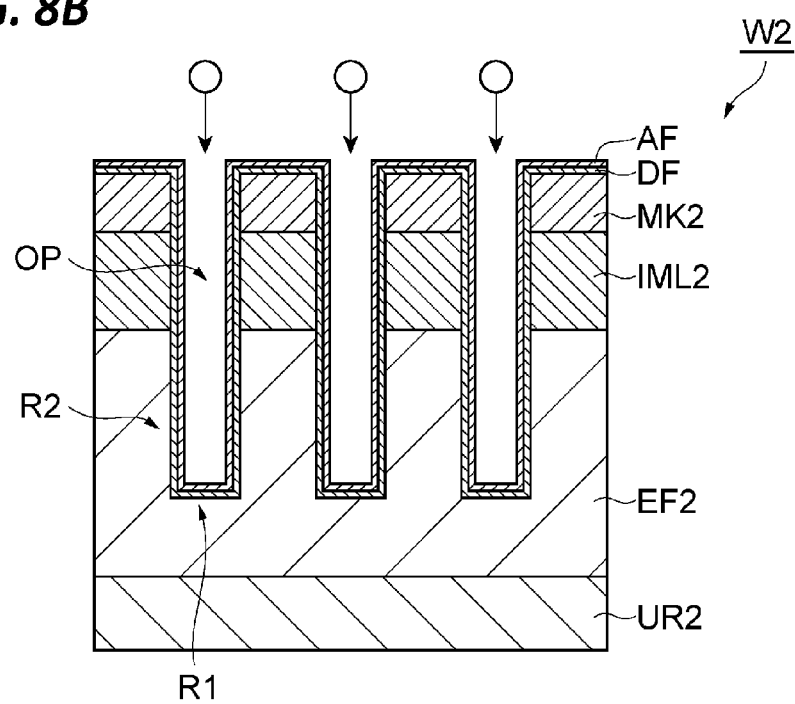
FIG. 8B is a view for explaining step ST3.
Figure 9A:
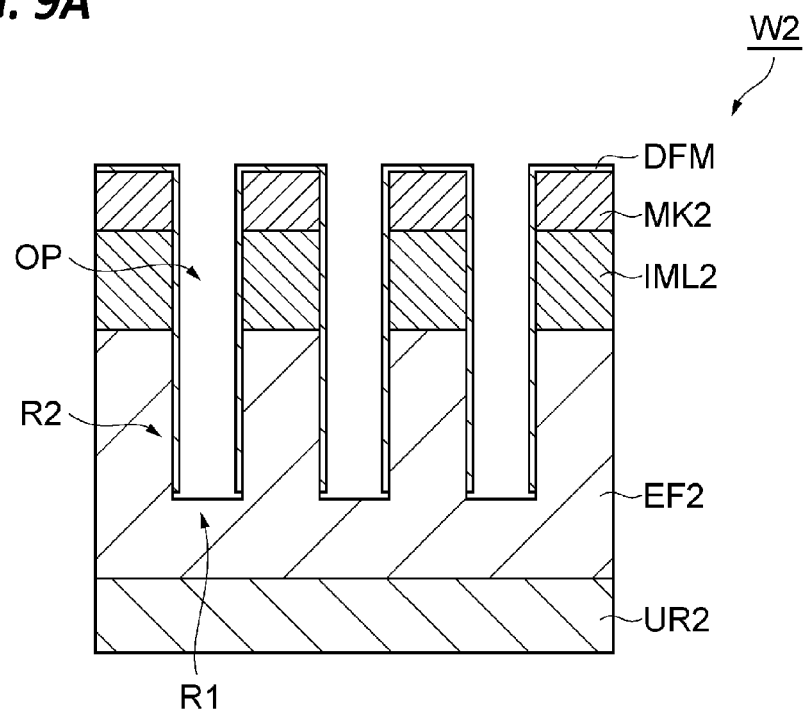
FIG. 9A is a partially enlarged cross-sectional view of the other exemplary substrate in a state after execution of step ST3.
Figure 9B:
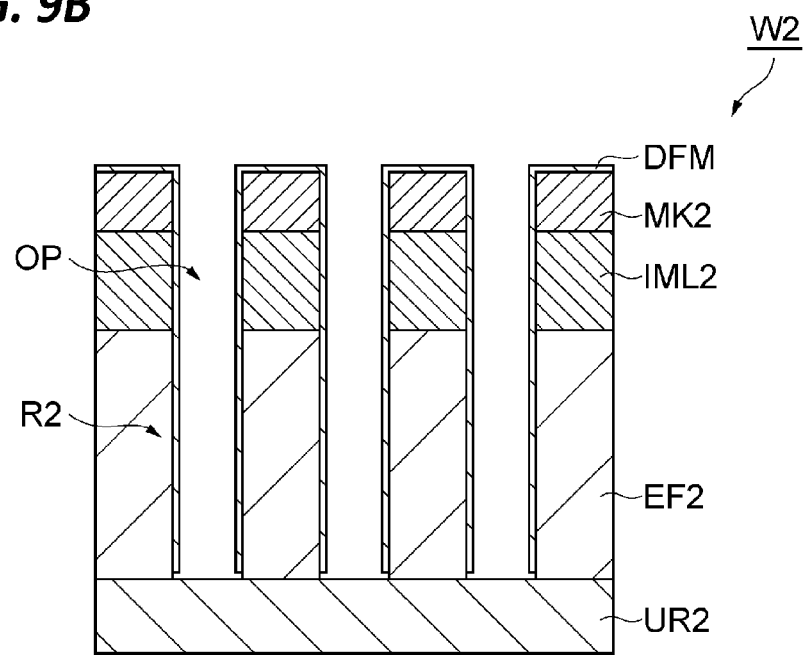
FIG. 9B is a partially enlarged cross-sectional view of the other exemplary substrate in a state after completion of the method illustrated in FIG. 1.

Hereinafter, descriptions will be made on several examples in which method MT is applied to a substrate different from the substrate W1 illustrated in FIG. 2A. Hereinafter, reference will be made to FIGS. 7A, 7B, 8A, 8B, 9A and 9B. FIG. 7A is a partially enlarged cross-sectional view of another exemplary substrate, to which the method illustrated in FIG. 1 may be applied, and FIG. 7B is a partially enlarged cross-sectional view of the other exemplary substrate in a state after execution of step ST1. FIG. 8A is a partially enlarged cross-sectional view of the other exemplary substrate in a state after execution of step ST2, and FIG. 8B is a view for explaining step ST3. FIG. 9A is a partially enlarged cross-sectional view of the other exemplary substrate in a state after execution of step ST3, and FIG. 9B is a partially enlarged cross-sectional view of the other exemplary substrate in a state after completion of the method illustrated in FIG. 1. Hereinafter, method MT will be described by taking as an example a case where the plasma processing apparatus 1 is used and a substrate W2 illustrated in FIG. 7A is processed. In addition, in the following description, method MT applied to the substrate W2 will be mainly described based on differences from method MT applied to the substrate W1.

As illustrated in FIG. 7A, the substrate W2 includes a base region UR2, a film EF2, an intermediate layer IML2, and a mask MK2. The film EF2 is provided on the base region UR2. The intermediate layer IML2 is provided on the film EF2. The mask MK2 is provided on the intermediate layer IML2. The mask MK2 and the intermediate layer IML2 provide a pattern to be transferred to the film EF2. That is, the mask MK2 and the intermediate layer IML2 provide one or more openings OP. The mask MK2 is formed of, for example, a metal. In one example, the mask MK2 is formed of a TiN film. In one example, the intermediate layer IML2 is formed of a multilayer film including a TEOS film and a SiOC film. The film EF2 is a film having a low dielectric constant. In one example, the film EF2 is a SiOCH film.

In step ST1, the deposition film DF is formed on the substrate W2, as illustrated in FIG. 7B, similarly to step ST1 applied to the substrate W1. In addition, FIG. 7B illustrates a state where the bottom of an opening OP is positioned between the upper surface and the lower surface of the film EF2 as a result of performing etching of the film EF2.

In one example where the film EF2 is a SiOCH film, the deposition film DF includes carbon and fluorine. In one example where the film EF2 is a SiOCH film, the first gas includes, for example, a fluorocarbon gas. Examples of the fluorocarbon gas include $C_4F_8$ gas. In step ST1, similarly to step ST1 applied to the substrate W1, plasma may be generated from the first gas. In step ST1, the chemical species from the plasma generated from the first gas is deposited on the substrate W2 to form the deposition film DF. In step ST1, etching of the film EF2 may occur at the bottom of the opening OP by the chemical species from the plasma generated from the first gas.

In step ST2, similarly to step ST2 applied to the substrate W1, the adsorption film AF is formed on the substrate W2 on which the deposition film DF has been formed, as illustrated in FIG. 8A. In step ST2, as in step ST2 applied to the substrate W1, the gaseous precursor is supplied to the inner space 10s. In step ST2, similarly to step ST2 applied to the substrate W1, plasma is not generated in the inner space 10s. The gaseous precursor reduces the amount of chemical species in the deposition film DF that etches the film EF2 in step ST3. The adsorption film AF may reduce the amount of fluorine in the deposition film DF. The gaseous precursor may be a silicon-containing gas. The silicon-containing gas is, for example, an aminosilane gas.

In step ST3, the first region R1 in the film EF2 is etched, similarly to step ST3 applied to the substrate W1. The first region R1 is the bottom portion defining the opening OP. In step ST3, similarly to step ST3 applied to the substrate W1, the ions from the plasma generated from the second gas are supplied to the substrate W2, on which the deposition film DF and the adsorption film AF have been formed, as illustrated in FIG. 8B. In addition, in FIG. 8B, circular figures represent the ions.

In step ST3, a chemical species in the deposition film DF and a chemical species of the adsorption film AF react with each other to form a protective film DFM from the deposition film DF, as illustrated in FIG. 9A. In one example, fluorine in the deposition film DF reacts with silicon of the adsorption film AF, and is removed from the deposition film DF. As a result, the protective film DFM is formed from the deposition film DF.

The amount of fluorine in the protective film DFM is less than the amount of fluorine in the deposition film DF. In addition, the content of carbon in the protective film DFM is relatively high. Thus, the etching rate of the second region R2 in step ST3 decreases. The second region R2 is a portion of the film EF2, and is a side portion defining the opening OP.

Meanwhile, in step ST3, a reaction occurs between the material of the first region R1 and the chemical species included in the deposition film DF (or the protective film DFM). The first region R1 is a portion of the film EF2, and is a side portion defining the opening OP. In step ST3, a reaction product generated by the reaction between the material of the first region R1 and the chemical species included in the deposition film DF is removed from the substrate W2. As a result, as illustrated in FIG. 9A, the first region R1 is etched. The reason why the second region R2 is protected by the protective film DFM but the first region R1 is etched is that an ion flux for the first region R1 is greater than an ion flux for the second region R2.

By executing the sequence that includes steps ST1, ST2 and ST3 a predetermined number of times, the opening OP is formed, as illustrated in FIG. 9B. In FIG. 9B, the opening OP extends to the surface of the base region UR.

Figure 10A:
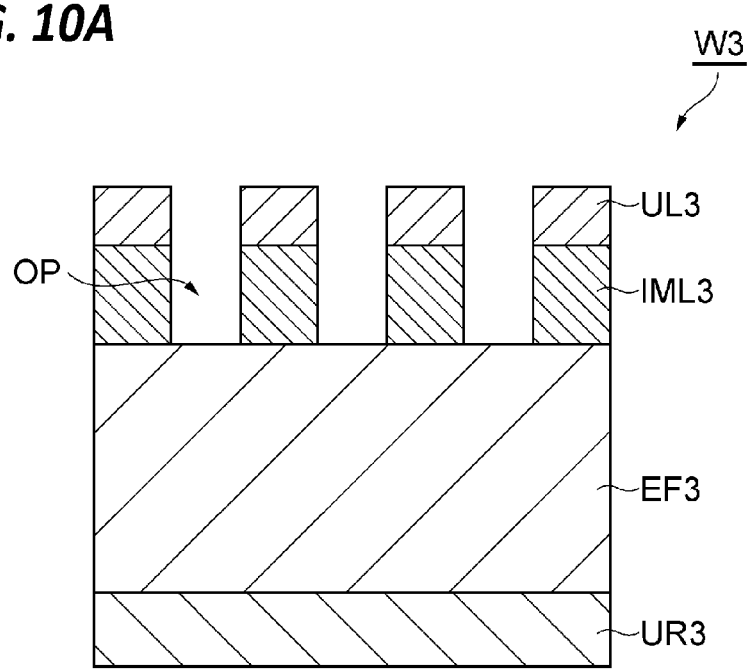
FIG. 10A is a partially enlarged cross-sectional view of a further exemplary substrate, to which the method illustrated in FIG. 1 may be applied.
Figure 10B:
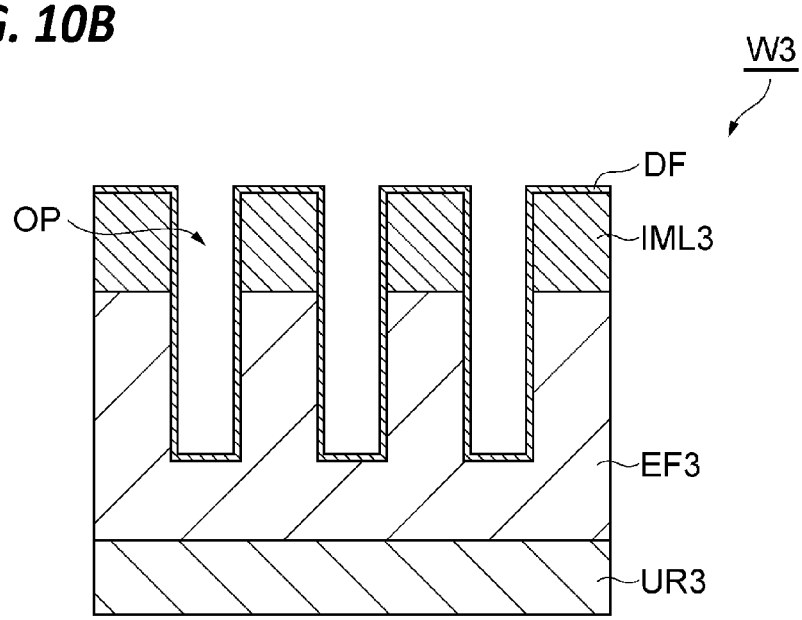
FIG. 10B is a partially enlarged cross-sectional view of the further exemplary substrate in a state after execution of step ST1.
Figure 11A:
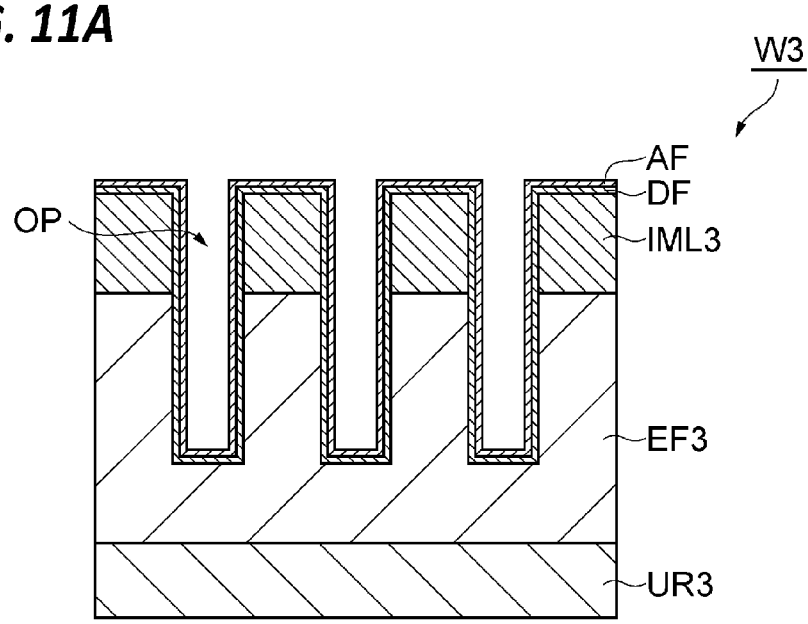
FIG. 11A is a partially enlarged cross-sectional view of the further exemplary substrate in a state after execution of step ST2.
Figure 11B:
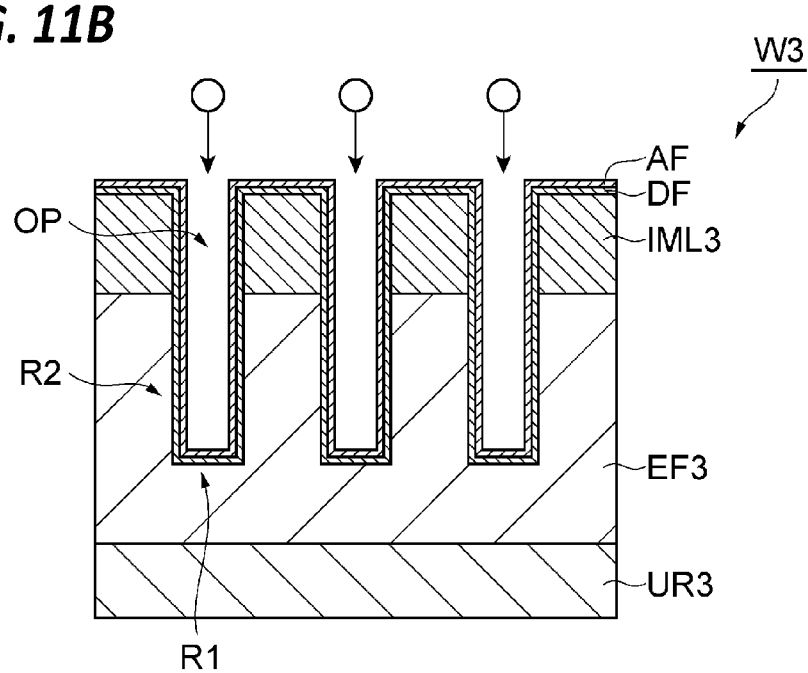
FIG. 11B is a view for explaining step ST3.
Figure 12A:
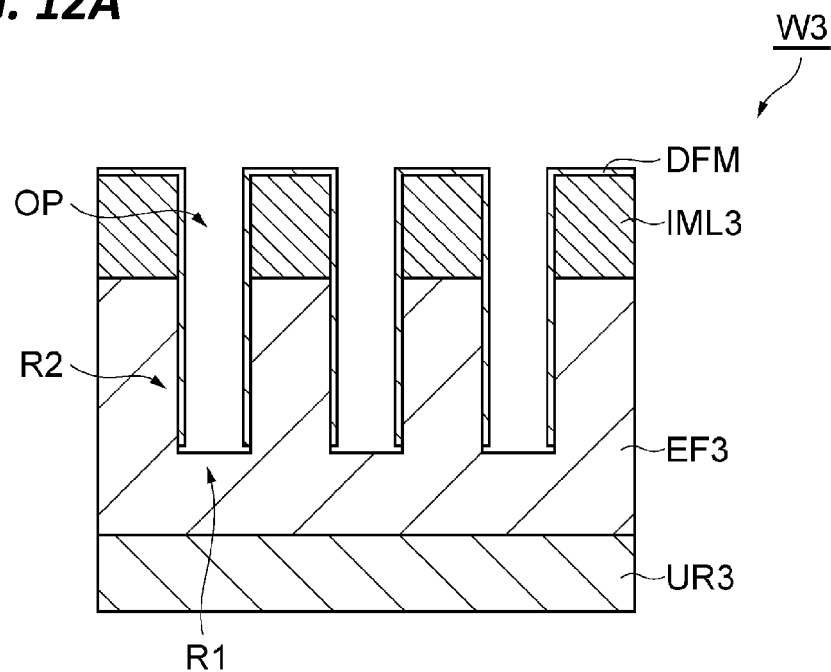
FIG. 12A is a partially enlarged cross-sectional view of the further exemplary substrate in a state after execution of step ST3.
Figure 12B:
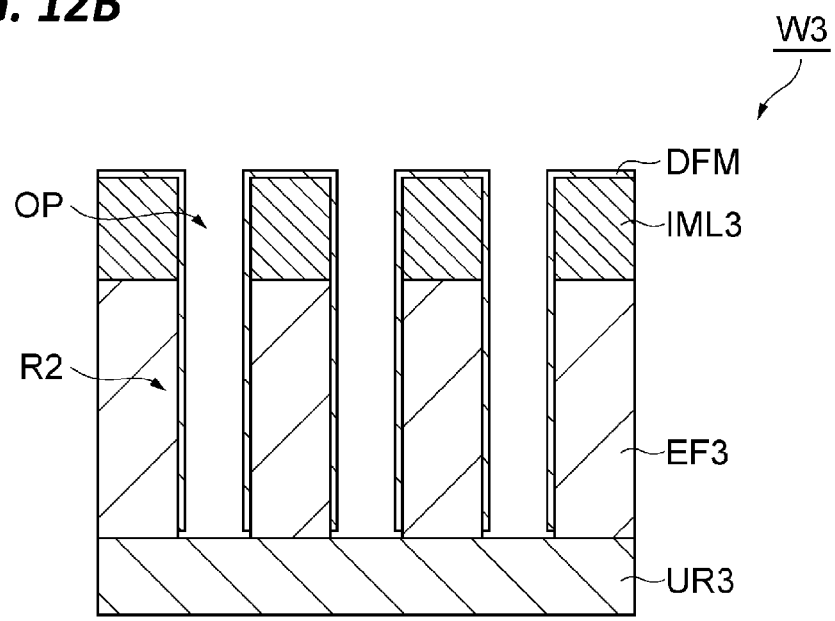
FIG. 12B is a partially enlarged cross-sectional view of the further exemplary substrate in a state after completion of the method illustrated in FIG. 1.

Hereinafter, reference will be made to FIGS. 10A, 10B, 11A, 11B, 12A and 12B. FIG. 10A is a partially enlarged cross-sectional view of a further exemplary substrate to which the method illustrated in FIG. 1 may be applied, and FIG. 10B is a partially enlarged cross-sectional view of the further exemplary substrate in a state after execution of step ST1. FIG. 11A is a partially enlarged cross-sectional view of the further exemplary substrate in a state after execution of step ST2, and FIG. 11B is a view for explaining step ST3. FIG. 12A is a partially enlarged cross-sectional view of the further exemplary substrate in a state after execution of step ST3, and FIG. 12B is a partially enlarged cross-sectional view of the further exemplary substrate in a state after completion of the method illustrated in FIG. 1. Hereinafter, method MT will be described by taking as an example a case where the plasma processing apparatus 1 is used so that a substrate W3 illustrated in FIG. 10A is processed. In addition, in the following description, method MT applied to the substrate W3 will be mainly described based on differences from method MT applied to the substrate W1.

As illustrated in FIG. 10A, the substrate W3 includes a base region UR3, a film EF3, an intermediate layer IML3, and an upper layer UL3. The film EF3 is formed on the base region UR3. The intermediate layer IML3 is formed on the film EF3. The upper layer UL3 is formed on the intermediate layer IML3. The upper layer UL3 and the intermediate layer IML3 provide a pattern to be transferred to the film EF3. That is, the upper layer UL3 and the intermediate layer IML3 provide one or more openings OP. In one example, the upper layer UL3 is formed from a silicon-containing antireflection film. The upper layer UL3 is patterned by being etched through a resist mask formed thereon. In one example, the intermediate layer IML3 is formed of an organic film. The organic film may be, for example, a spin-on-carbon film. The film EF3 may be a silicon containing film. In one example, the film EF3 is a silicon oxide film.

In step ST1, the deposition film DF is formed on the substrate W3, as illustrated in FIG. 10B, similarly to step ST1 applied to the substrate W1. In addition, FIG. 10B illustrates a state where the bottom of the opening OP is positioned between the upper surface and the lower surface of the film EF3 as a result of performing etching of the film EF3. In one example, since the upper layer UL3 is a silicon-containing antireflection film and the film EF3 is a silicon oxide film, the upper layer UL3 disappears during the etching of the film EF3. In a state illustrated in FIG. 10B, the upper layer UL3 disappears.

In one example where the film EF3 is a silicon oxide film, the deposition film DF includes carbon and fluorine. In one example where the film EF3 is a silicon oxide film, the first gas includes, for example, a fluorocarbon gas. Examples of the fluorocarbon gas include $C_4F_6$ gas. The first gas may further include a hydrofluorocarbon gas. Examples of the hydrofluorocarbon gas include $CH_3F$ gas. In step ST1, similarly to step ST1 applied to the substrate W1, plasma may be generated from the first gas. In step ST1, the chemical species from the plasma generated from the first gas is deposited on the substrate W3 to form the deposition film DF. In step ST1, etching of the film EF3 may occur at the bottom of the opening OP by the chemical species from the plasma generated from the first gas.

In step ST2, similarly to step ST2 applied to the substrate W1, the adsorption film AF is formed on the substrate W3, on which the deposition film DF has been formed, as illustrated in FIG. 11A. In step ST2, as in step ST2 applied to the substrate W1, the gaseous precursor is supplied to the inner space 10s. In step ST2, similarly to step ST2 applied to the substrate W1, plasma is not generated in the inner space 10s. The gaseous precursor reduces the amount of chemical species in the deposition film DF that etches the film EF3 in step ST3. The adsorption film AF may reduce the amount of fluorine in the deposition film DF. The gaseous precursor may be a silicon-containing gas. The silicon-containing gas is, for example, an aminosilane gas.

In step ST3, the first region R1 in the film EF3 is etched, similarly to step ST3 applied to the substrate W1. The first region R1 is the bottom portion defining the opening OP. In step ST3, similarly to step ST3 applied to the substrate W1, the ions from the plasma generated from the second gas are supplied to the substrate W3, on which the deposition film DF and the adsorption film AF have been formed, as illustrated in FIG. 11B. In addition, in FIG. 11B, circular figures represent the ions.

As illustrated in FIG. 12A, in step ST3, the chemical species in the deposition film DF reacts with the chemical species of the adsorption film AF, so that the protective film DFM is formed from the deposition film DF. In one example, fluorine in the deposition film DF reacts with silicon of the adsorption film AF, and is removed from the deposition film DF. As a result, the protective film DFM is formed from the deposition film DF.

The amount of fluorine in the protective film DFM is less than the amount of fluorine in the deposition film DF. In addition, the content of carbon in the protective film DFM is relatively high. Thus, the etching rate of the second region R2 in step ST3 decreases. The second region R2 is a portion of the film EF3, and is a side portion defining the opening OP.

Meanwhile, in step ST3, a reaction occurs between the material of the first region R1 and the chemical species included in the deposition film DF (or the protective film DFM). The first region R1 is a portion of the film EF3, and is a side portion defining the opening OP. In step ST3, a reaction product generated by the reaction between the material of the first region R1 and the chemical species included in the deposition film DF is removed from the substrate W2. As a result, as illustrated in FIG. 12A, the first region R1 is etched. The reason why the second region R2 is protected by the protective film DFM but the first region R1 is etched is that an ion flux for the first region R1 is greater than an ion flux for the second region R2.

By executing the sequence that includes steps ST1, ST2 and ST3 a predetermined number of times, the opening OP is formed, as illustrated in FIG. 12B. In FIG. 12B, the opening OP extends to the surface of the base region UR.

While various embodiments have been described above, various modifications may be made without being limited to the above-described embodiments. For example, method MT may be performed using a plasma processing apparatus other than a capacitively coupled plasma processing apparatus. The plasma processing apparatus used to execute method MT may be an inductively coupled plasma processing apparatus or a plasma processing apparatus that generates plasma using surface waves such as microwaves.

In addition, the substrate to be processed in method MT is not limited to the substrate W1, the substrate W2, and the substrate W3. Method MT may be executed in order to selectively etch the first region of the substrate with respect to the second region of the substrate W2. The first region and the second region may be formed of different materials. Alternatively, the first region and the second region may include different portions of the same film, such as the first region R1 and the second region R2 of the substrate W2 and the substrate W3, respectively.

Hereinafter, some tests conducted for evaluating method MT will be described. The tests to be described below do not limit the present disclosure.

<First Test and First Comparative Test>

In the first test, a silicon nitride film and a silicon oxide film were processed by executing method MT using the plasma processing apparatus 1. In the first comparative test, the silicon nitride film and the silicon oxide film were processed by performing a processing, which is different from the first test in terms that step ST2 and step STb are not executed, using the plasma processing apparatus 1. In the first test, a relationship between the number of executions of a sequence that includes step ST1, step ST2, step STb, and step ST3 and the selectivity was obtained. In the first comparative test, a relationship between the number of executions of the sequence that includes step ST1 and step ST3 and the selectivity was obtained. The selectivity is a value obtained by dividing the etching rate of the silicon nitride film by the etching rate of the silicon oxide film. Hereinafter, conditions of the first test will be described.

<Conditions of First Test>

Figure 13:
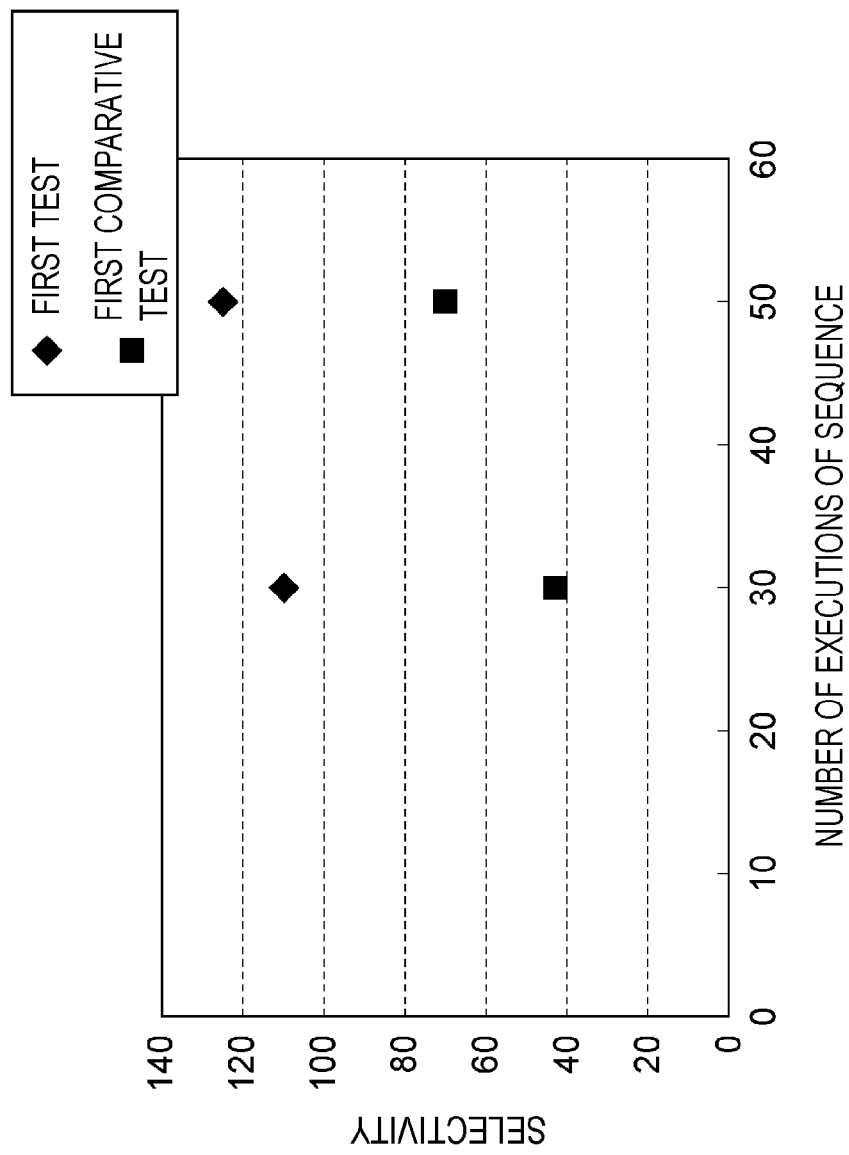
FIG. 13 is a graph illustrating the results of a first test and a first comparative test.

Step ST1
Pressure in the inner space 10s: 20 mTorr (2.666 Pa)
First high frequency power: 60 MHz, 100 W
Second high frequency power: 40 MHz, 100 W
Flow rate of $CH_3F$ gas/Flow rate of Ar gas: 15 sccm/200 sccm
Processing time: 5 seconds
Step ST2
Pressure in the inner space 10s: 200 mTorr (26.66 Pa)
First high frequency power: 0 W
Second high frequency power: 0 W
Flow rate of Aminosilane gas/Flow rate of Ar gas: 100 sccm/300 sccm
Processing time: 15 seconds
Step STb
Pressure in the inner space 10s: 200 mTorr (26.66 Pa)
First high frequency power: 0 W
Second high frequency power: 0 W
Flow rate of Ar gas: 300 sccm
Processing time: 10 seconds
Step ST3
Pressure in the inner space 10s: 20 mTorr (2.666 Pa)
First high frequency power: 60 MHz, 100 W
Second high frequency power: 40 MHz, 300 W
Flow rate of Ar gas: 200 sccm
Processing time: 5 seconds FIG. 13 is a graph illustrating the results of the first test and the first comparative test. In the graph of FIG. 13, the horizontal axis represents the number of executions of the sequence, and the vertical axis represents the selectivity. As illustrated in FIG. 13, the selectivity in the first test was considerably greater than the selectivity in the first comparative test. That is, according to method MT, it was confirmed that the silicon nitride film may be etched with a higher selectivity than that of the silicon oxide film. In addition, the selectivity of the first test increased with an increase in the number of executions of the sequence.

<Second Test and Second Comparative Test>

In the second test, a silicon nitride film and a polycrystalline silicon film were processed under the same conditions as in the first test. In the second comparative test, the silicon nitride film and the polycrystalline silicon film were processed under the same conditions as in the first comparative test. In the second test, a relationship between the number of executions of the sequence that includes step ST1, step ST2, step STb, and step ST3 and the selectivity was obtained. In the second comparative test, a relationship between the number of executions of a sequence that includes step ST1 and step ST3 and the selectivity was obtained. The selectivity is a value obtained by dividing the etching rate of the silicon nitride film by the etching rate of the polycrystalline silicon film.

Figure 14:
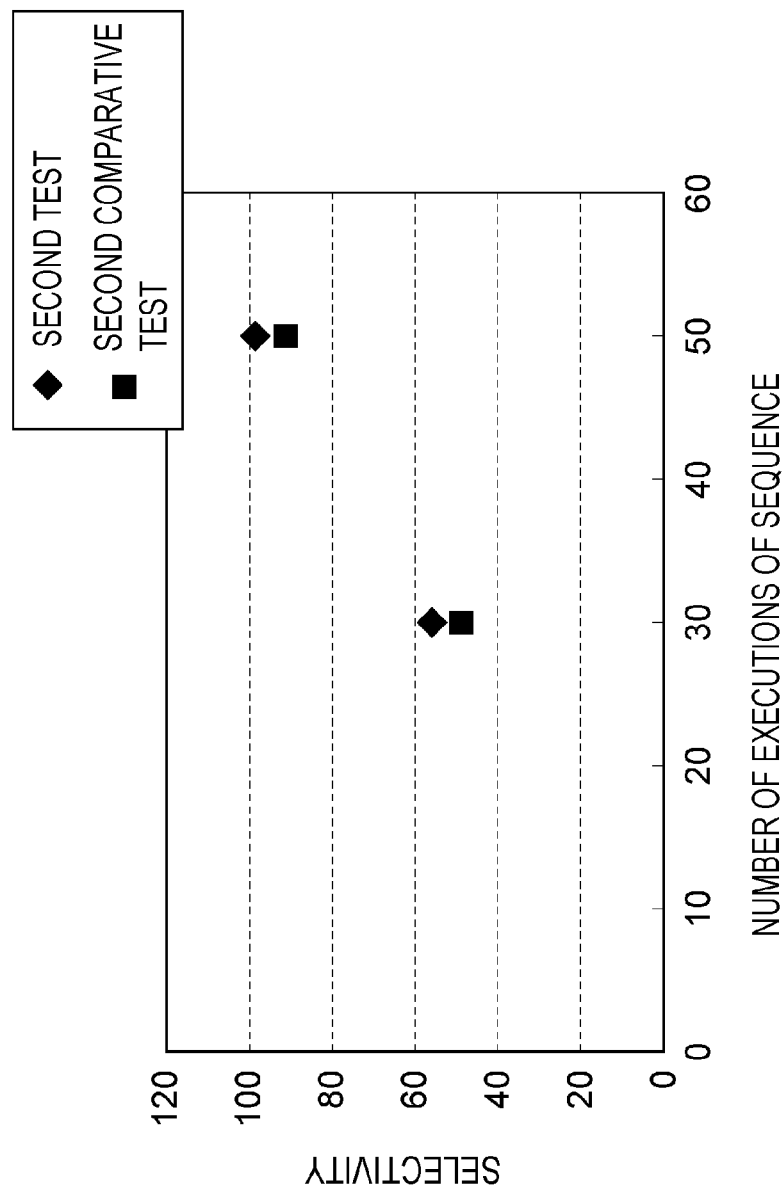
FIG. 14 is a graph illustrating the results of a second test and a second comparative test.

FIG. 14 is a graph illustrating the results of the second test and the second comparative test. In the graph of FIG. 14, the horizontal axis represents the number of executions of the sequence, and the vertical axis illustrates the selectivity. As illustrated in FIG. 14, the selectivity in the second test was greater than the selectivity in the second comparative test. That is, according to method MT, it was confirmed that the silicon nitride film may be etched with a higher selectivity than that of the polycrystalline silicon film. In addition, the selectivity in the second test increased with an increase in the number of executions of the sequence is executed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of etching a substrate, the method comprising:
   forming a deposition film on the substrate from a chemical species included in a plasma generated from a first gas, the substrate having a first region and a second region formed of a different material than the first region;

supplying a gaseous precursor to the substrate having the deposition film formed thereon, thereby forming an adsorption film on the substrate using the gaseous precursor; and selectively etching the first region with respect to the second region by supplying ions from a plasma generated from a second gas to the substrate having the deposition film and the adsorption film formed thereon so as to cause a reaction between the material of the first region and a chemical species included in the deposition film while reducing an etching rate of the second region by the adsorption film.

2. The method of claim 1, wherein the adsorption film reduces an amount of a chemical species in the deposition film that etches the second region.

3. The method of claim 1, wherein the deposition film includes carbon, hydrogen, and fluorine.

4. The method of claim 3, wherein the first region is formed of silicon nitride.

5. The method of claim 3, wherein the adsorption film reduces an amount of fluorine in the deposition film that etches the second region.

6. The method of claim 1, wherein the first gas includes a hydrofluorocarbon gas.

7. The method of claim 6, wherein the hydrofluorocarbon gas includes $CH_3F$ gas.

8. The method of claim 1, wherein the second region includes silicon.

9. The method of claim 8, wherein the adsorption film includes silicon.

10. The method of claim 1, wherein the gaseous precursor is a silicon-containing gas.

11. A method of etching a substrate, the method comprising:

providing a substrate having a first region and a second region formed of a different material from the first region;

forming a deposition film on the substrate;

forming a monomolecular adsorption film on the substrate having the deposition film formed thereon; and selectively etching the first region with respect to the second region by supplying ions from a plasma to the substrate having the deposition film and the adsorption film formed thereon so as to cause a reaction between a material of the first region and a chemical species included in the deposition film while reducing an etching rate of the second region by the adsorption film.

12. The method of claim 11, further including forming an opening in the substrate such that, the first region is a bottom portion defining the opening, and the second region is a side portion defining the opening.

13. The method of claim 12, wherein the substrate includes a film including the first region and the second region, and the opening is formed in the film.

14. The method of claim 13, wherein the film is either a silicon oxide film or a SiOCH film.

15. The method of claim 11, wherein the deposition film includes carbon and fluorine, and the adsorption film reduces an amount of fluorine in the deposition film.

16. A plasma processing apparatus comprising:

a chamber having an inner space;

a support which supports a substrate in the inner space of the chamber;

a gas supply unit which supplies gases to the inner space of the chamber, wherein the gases include at least a first gas, a second gas, and a gaseous precursor;

a plasma generation unit which excites the gas in the inner space of the chamber so as to generate plasma; and a controller which controls the gas supply unit and the plasma generation unit, wherein the controller controls the gas supply unit and the plasma generation unit so as to generate plasma from the first gas in the inner space of the chamber in a state where the substrate including a first region and a second region formed of a different material than the first region, is placed on the support, so that a deposition film is formed on the substrate from a chemical species included in the plasma generated from the first gas, the controller controls the gas supply unit to supply the gaseous precursor to the substrate in a state where the substrate having the deposition film formed thereon is placed on the support, to form an adsorption film on the substrate using the gaseous precursor, the controller controls the gas supply unit and the plasma generation unit so as to generate plasma from a second gas in the inner space of the chamber in a state where the substrate having the deposition film and the adsorption film formed thereon is placed on the support, ions from the plasma generated using the second gas are supplied to the substrate so that the first region is etched via a reaction between the material of the first region and a chemical species included in the deposition film, and the adsorption film reduces an etching rate of the second region during the etching of the first region.

* * * * *